(12) United States Patent
Hong et al.

(10) Patent No.: US 9,324,932 B2
(45) Date of Patent: Apr. 26, 2016

(54) PIEZOELECTRIC DEVICE

(71) Applicant: NATIONAL TSING HUA UNIVERSITY, Hsinchu (TW)

(72) Inventors: Chien-Chong Hong, Zhubei (TW); Alan Chen, Kaohsiung (TW); Tong-Miin Liou, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 552 days.

(21) Appl. No.: 13/923,061

(22) Filed: Jun. 20, 2013

(65) Prior Publication Data

US 2014/0175951 A1    Jun. 26, 2014

(30) Foreign Application Priority Data

Dec. 20, 2012 (TW) .............................. 101148685 A

(51) Int. Cl.
| | |
|---|---|
| H01L 41/22 | (2013.01) |
| H01L 41/09 | (2006.01) |
| B28B 11/04 | (2006.01) |
| H01L 41/083 | (2006.01) |
| H01L 41/193 | (2006.01) |
| H01L 41/333 | (2013.01) |

(52) U.S. Cl.
CPC ............ *H01L 41/083* (2013.01); *H01L 41/193* (2013.01); *H01L 41/333* (2013.01)

(58) Field of Classification Search
CPC .......................... B41J 2/1623; C08J 5/18–5/22
USPC .................. 310/340, 800; 29/25.35; 428/141; 264/293
See application file for complete search history.

(56) References Cited

U.S. PATENT DOCUMENTS

| | | | |
|---|---|---|---|
| 2009/0047445 A1* | 2/2009 | Schneider et al. ............. | 427/562 |
| 2009/0226622 A1* | 9/2009 | Kodani et al. ............... | 427/385.5 |
| 2010/0249324 A1* | 9/2010 | Kodani et al. ................. | 525/199 |
| 2012/0055257 A1* | 3/2012 | Shaw-Klein .................... | 73/780 |
| 2012/0276333 A1* | 11/2012 | Hong et al. .................... | 428/141 |
| 2013/0256581 A1* | 10/2013 | Miyoshi et al. ........ | 252/62.9 PZ |

OTHER PUBLICATIONS

Chen et al., "Flexible Tactile Sensors Based on Nanoimprinted Sub-20 NM Piezoelectric Copolymer Nanograss Films", IEEE Sensors, Oct. 28-31, 2012, 4 pages.

* cited by examiner

*Primary Examiner* — Thomas Dougherty
(74) *Attorney, Agent, or Firm* — Birch, Stewart, Kolasch & Birch, LLP

(57) ABSTRACT

A piezoelectric device includes a nanoimprinted film which is made from a ferroelectric polymer having a first conformation state and coated on a substrate. The ferroelectric polymer is heated at a temperature between a Curie point (Tc) and a melting point (Tm) of the ferroelectric polymer to cause a change in conformation of the ferroelectric polymer from the first conformation state to a second conformation state, and is then subjected to a nanoimprinting process at an imprinting temperature lower than Tc to cause a change in conformation of the ferroelectric polymer from the second conformation state to a third conformation state that is different from the first conformation state, thereby obtaining the nanoimprinted film.

8 Claims, 13 Drawing Sheets

PIEZOELECTRIC DEVICE

CROSS-REFERENCE TO RELATED APPLICATION

This application claims priority of Taiwanese application no. 101148685, filed on Dec. 20, 2012.

BACKGROUND OF THE INVENTION

1. Field of the Invention

This invention relates to a piezoelectric device, more particularly to a piezoelectric device having a nanoimprinted film.

2. Description of the Related Art

A ferroelectric polymer material, such as poly(vinylidene fluoride-trifluoroethylene) (PVDF-TrFE), can be treated to exhibit piezoelectric property.

US 2009/0047445 A1 discloses a method of forming a piezoelectric device by the steps of: heating a piezoelectric precursor (such as PVDF-TrFE) to a temperature that is above a Curie temperature of the precursor, but below a melting temperature of the precursor; applying a voltage across the precursor; and reducing the temperature to below the Curie temperature while the voltage is applied.

Chien-Chong Hong (joint inventor of the present invention) et. al proposed a method of nanoimprinting a piezoelectric polymeric material for forming high aspect ratio nanopillars in U.S. application publication no. 2012/0276333 A1. The method includes heating a surface of the piezoelectric polymeric material to a temperature less than a Curie point of the polymeric material by not more than 25° C., and pressing the heated surface of the material using a nanoimprinting template such that the piezoelectric polymeric material is formed with nanopillars.

In an article entitled "Enhanced Piezoelectricity of Nanoimprinted Sub-20 nm Poly(vinylidene fluoride-trifluoroethylene) Copolymer Nanograss," 2012 American Chemical Society p 1580-1586, Chien-Chong Hong (joint inventor of the present invention) et al. further proposed poling the nanopillars of the piezoelectric polymeric material in an electric field and at an elevated temperature.

In is known in the art that, to obtain a piezoelectric material with better piezoelectric response, the most effective way is to apply an electric field (i.e., applying a voltage) across the piezoelectric material to reverse dipole moments of molecules in the material. However, such approach may result in undesirable breakdown of the piezoelectric material.

SUMMARY OF THE INVENTION

An object of the present invention is to provide a piezoelectric device which is made without applying an electric field to the piezoelectric material.

Accordingly, a piezoelectric device of this invention is made by the following steps of:

(a) providing a coating material including a ferroelectric polymer;

(b) applying the coating material onto a lower substrate unit to obtain a coated film in which the ferroelectric polymer has a first conformation state;

(c) heating the coated film at a heating temperature between a Curie point (Tc) and a melting point (Tm) of the ferroelectric polymer to cause a change in conformation of the ferroelectric polymer from the first conformation state to a second conformation state; and (d) subjecting the heat-treated coated film to a nanoimprinting process at an imprinting temperature lower than Tc to cause a change in conformation of the ferroelectric polymer from the second conformation state to a third conformation state that is different from the first conformation state, thereby obtaining a nanoimprinted film.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
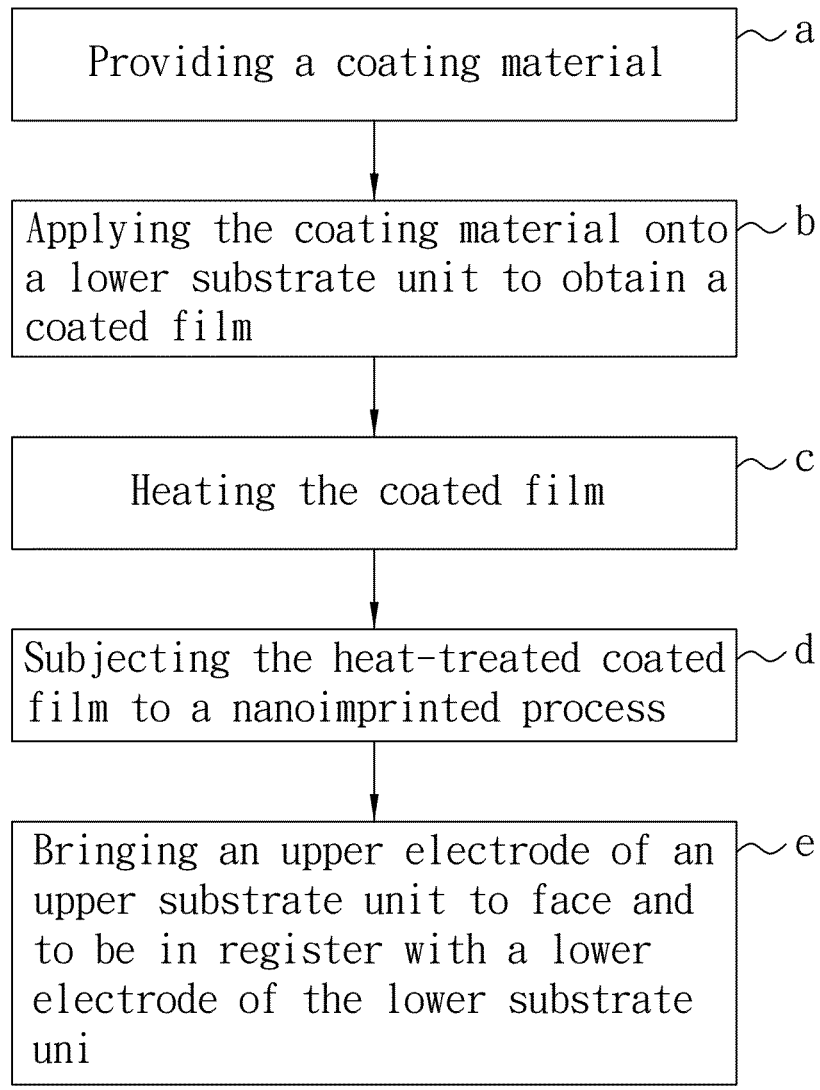
FIG. 1 is a block diagram showing the preferred embodiment of a method for making a piezoelectric device according to this invention.
Figure 2:
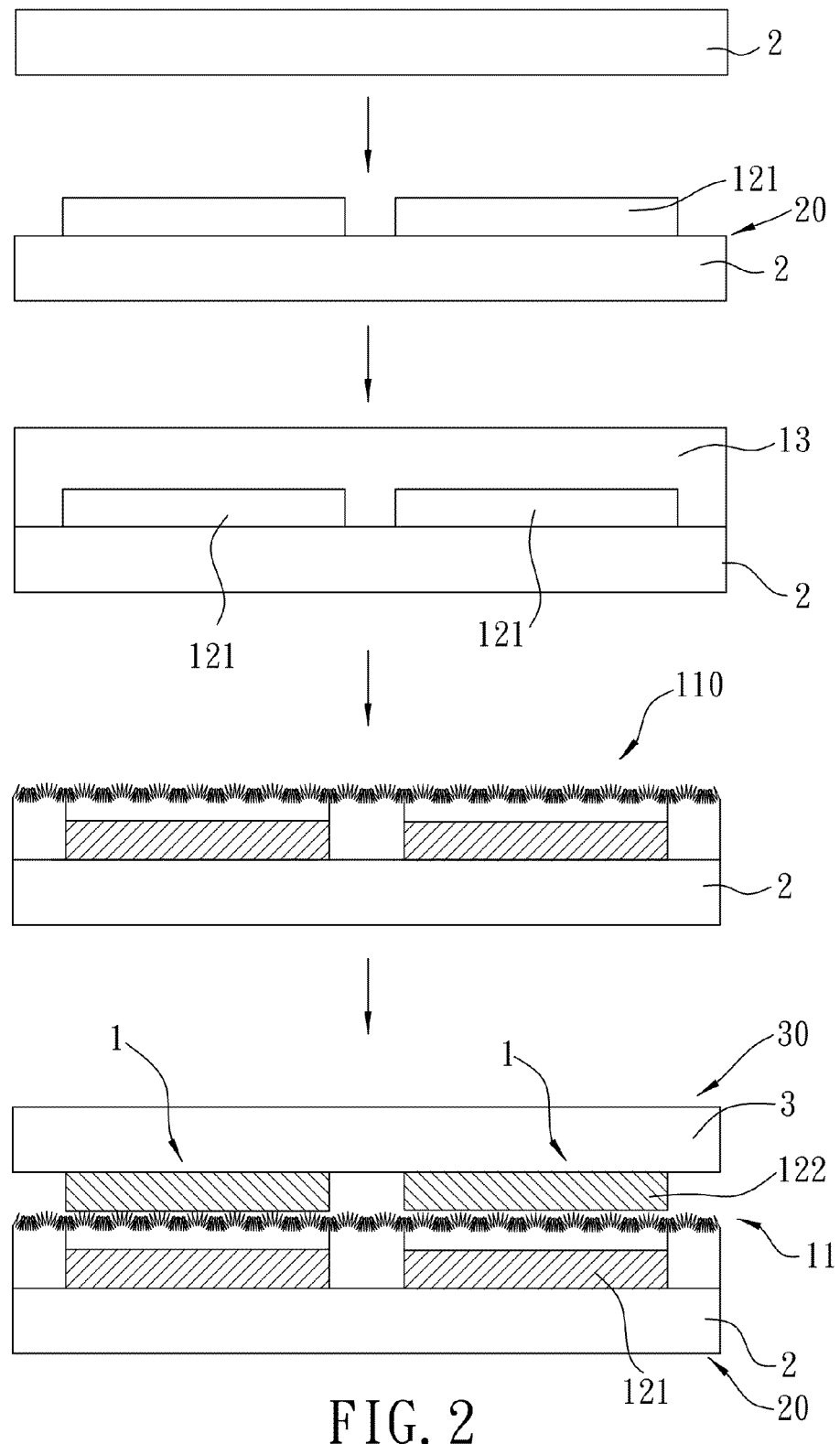
FIG. 2 is a flow diagram illustrating the preferred embodiment of the method for making the piezoelectric device according to this invention.
Figure 3:
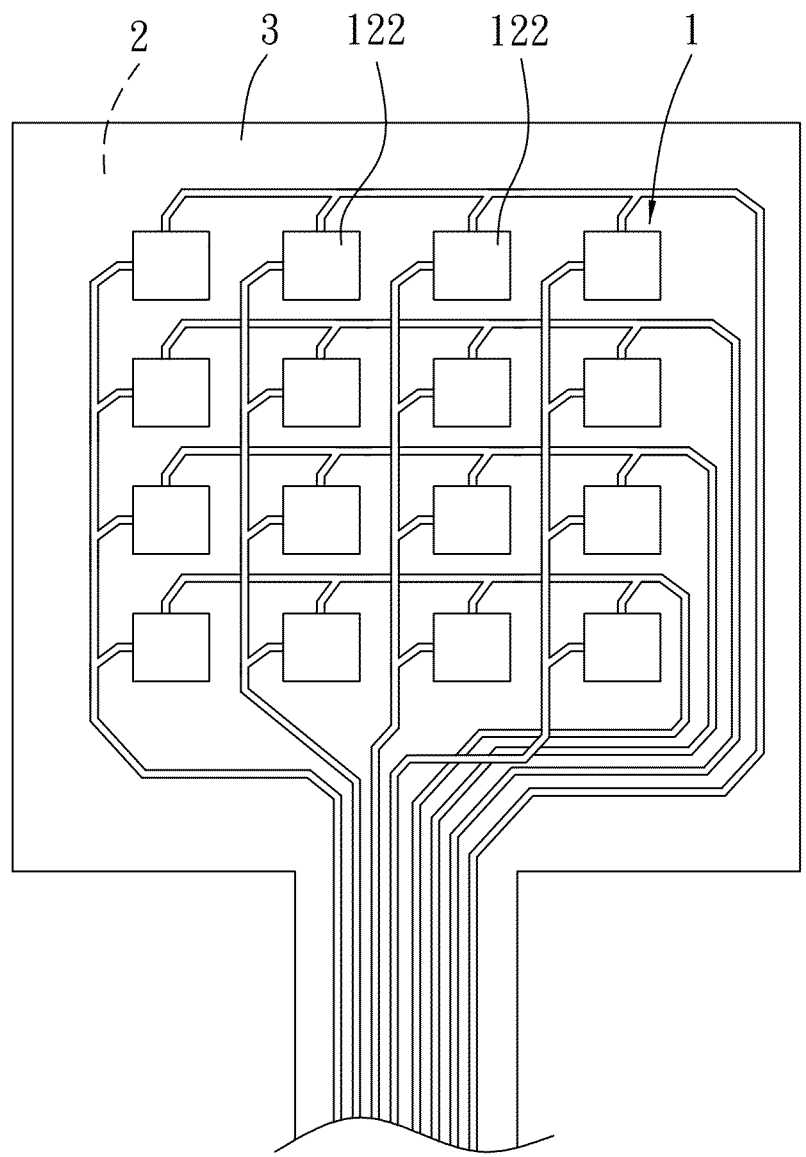
FIG. 3 illustrates an array of flexible, tactile sensors made according to the method of this invention.

Referring to FIGS. 1 to 3, the preferred embodiment of a piezoelectric device 1 according to this invention is made by the following steps (a) to (e).

In step (a), a coating material is provided. The coating material includes a ferroelectric polymer and a solvent for dissolving the ferroelectric polymer. In the preferred embodiment, the ferroelectric polymer is poly(vinylidene fluoride-trifluoroethylene) (PVDF-TrFE), and the solvent is methyl ethyl ketone (MEK).

In step (b), the coating material is applied onto a lower substrate unit 20 to obtain a coated film 13 in which the ferroelectric polymer has a first conformation state. In this embodiment, the lower substrate unit 20 includes a lower substrate body 2 and a lower electrode 121 disposed on an upper surface of the lower substrate body 2, and the coating material is applied to overlie the lower substrate body 2 and to embrace the lower electrode 121.

In step (c), the coated film 13 is heated at a heating temperature between a Curie point (Tc) and a melting point (Tm)

of the ferroelectric polymer to cause a change in conformation of the ferroelectric polymer from the first conformation state to a second conformation state. In the preferred embodiment, the ferroelectric polymer (PVDF-TrFE) is recrystallized to have a predominantly beta crystalline phase. Preferably, the heating temperature is lower than Tm by not more than 15° C., and the coated film 13 is heated for 2~5 hours.

In step (d), the heat-treated coated film 13 is subjected to a nanoimprinting process at an imprinting temperature lower than Tc to cause a change in conformation of the ferroelectric polymer from the second conformation state to a third conformation state that is different from the first conformation state.

Figure 4:
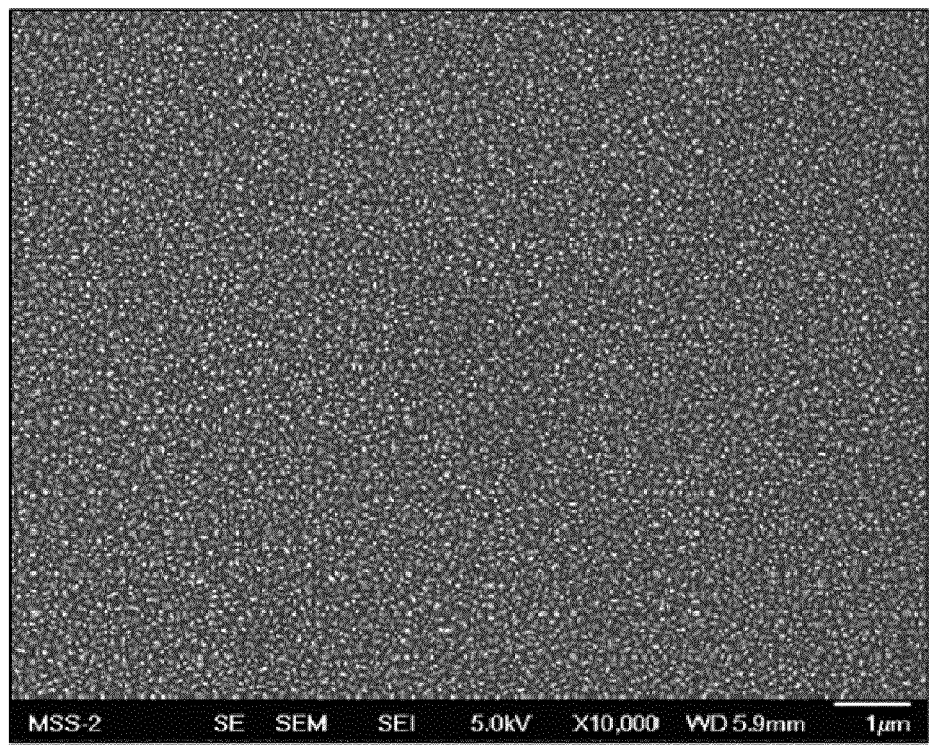
FIG. 4 is a top-view scanning electron microscope image of a nanoimprinting template for making the piezoelectric device.
Figure 5:
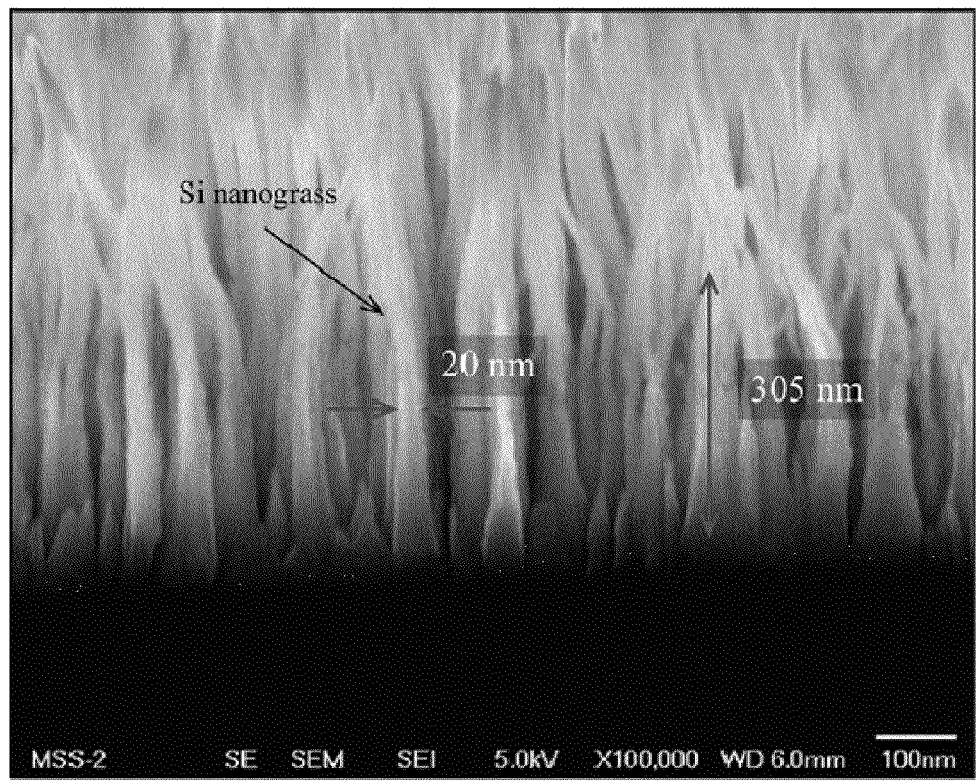
FIG. 5 is an inclined 70° view scanning electron microscope image of the nanoimprinting template.

In this embodiment, the nanoimprinting process is implemented by pressing the heat-treated coated film 13 against a nanoimprinting template which includes an imprinting substrate and a plurality of nanopillars extending upwardly from the imprinting substrate, thereby transforming the ferroelectric polymer to the third conformation state. Thereafter, the nanoimprinting template is removed. The nanoimprinting template is prepared according to the aforementioned article by Chien-Chong Hong et al., and in US 2012/0276333. FIGS. 4 and 5 show scanning electron microscope images of the nanoimprinting template.

Preferably, the imprinting temperature is lower than Tc by not more than 35° C. When the PVDF-TrFE copolymer powder is used for forming the coated film 13, the imprinting temperature preferably ranges from 90° C. to 100° C.

Figure 6:
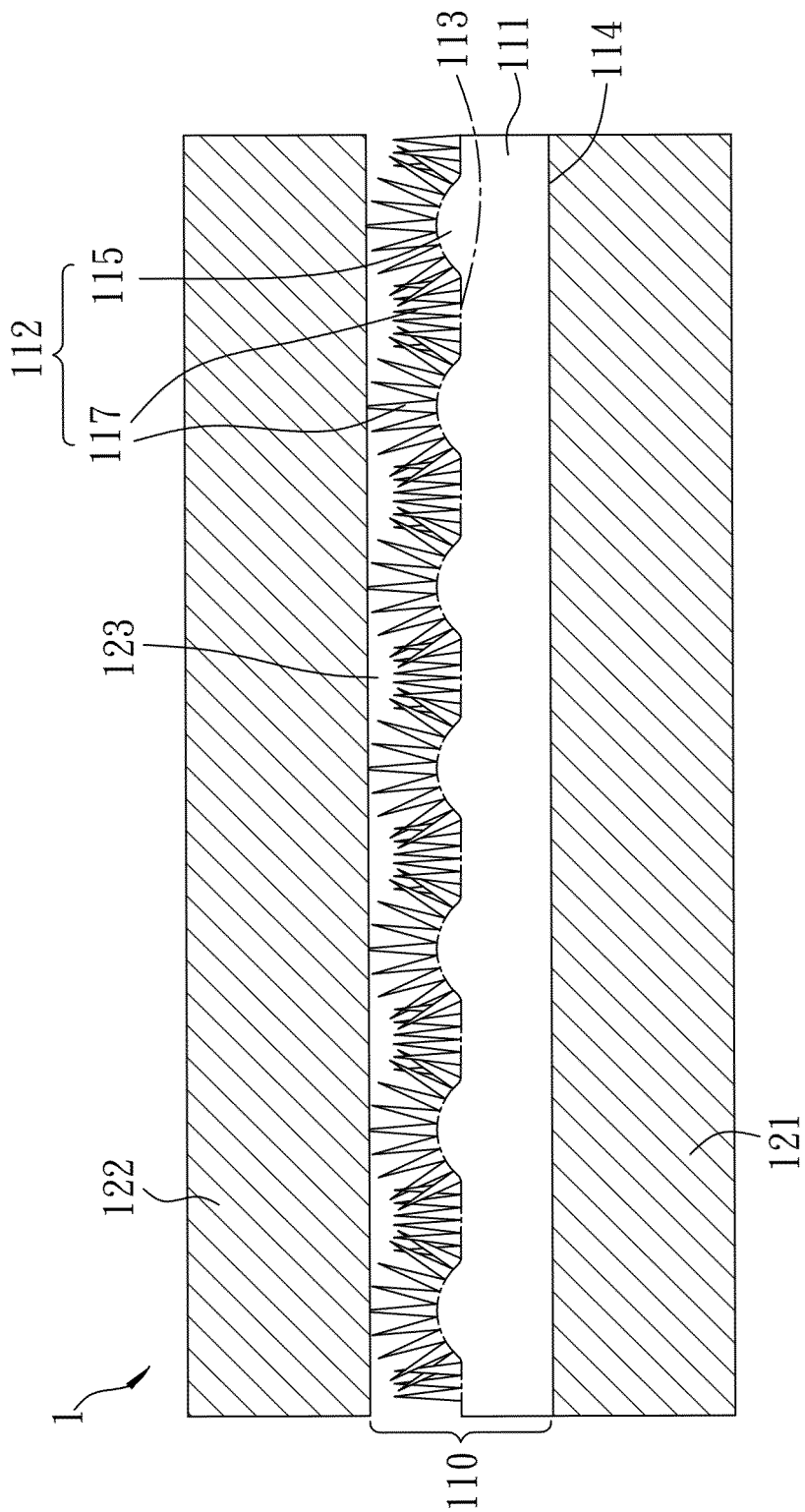
FIG. 6 is a schematic view of a nanoimprinted film in which poly(vinylidene fluoride-trifluoroethylene) (PVDF-TrFE) is in a third conformation state.
Figure 11:
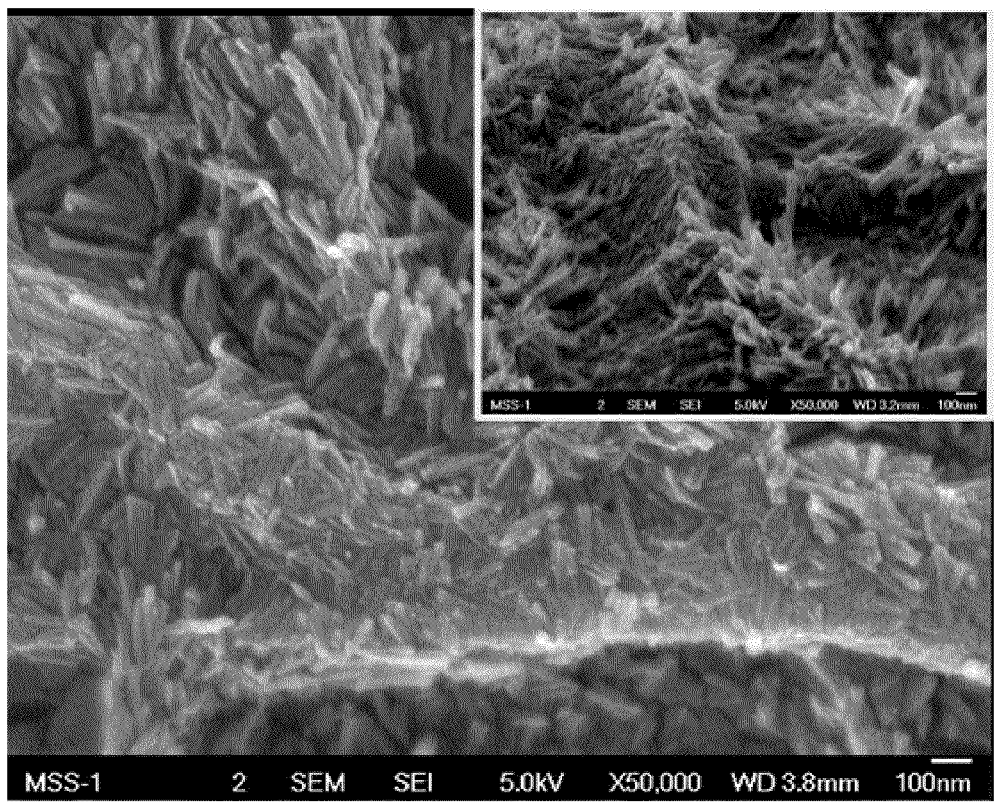
FIG. 11 is a scanning electron microscope image of Example C1.

In this step, the heat-treated coated film 13 is formed into a nanoimprinted film 110 in which the ferroelectric polymer is transformed to the third conformation state, and which includes a base portion 111 and an imprint portion 112 having a nano grass-like profile (see FIGS. 6 and 11). The base portion 111 has top and bottom sides 113, 114. The imprint portion 112 includes a plurality of nano-ribbons 115 and a plurality of nano-pillars 117. The nano-ribbons 115 each extend from the top side 113 of the base portion 111, and each have a width dimension ranging from 300 nm to 500 nm. Each of the nano-pillars 117 extends from the top side 113 of the base portion 111 or a respective one of the nano-ribbons 115 in a direction opposite to the bottom side 114, and has a width dimension ranging from 10 nm to 50 nm and an aspect ratio (a ratio of length to width) greater than 8.

It should be noted that if the coated film 13 of step (b) is not subjected to step (c) for recrystallization, the nano-ribbons 115 will not be formed on the nanoimprinted film when the coated film 13 is subjected to the nanoimprinting process. That is, the nanoimprinted film made by using the method disclosed in the aforementioned article by Chien-Chong Hong et al., or in US 2012/0276333 does not have nano-ribbons.

In step (e), an upper substrate unit 30, which includes an upper substrate body 3 and an upper electrode 122 disposed on a lower surface of the upper substrate body 3, is brought to face and to be in register with the lower electrode 121 such that the upper electrode 122 is spaced apart from the base portion 111 by the imprint portion 112. By virtue of the above steps, the piezoelectric device 1 of this invention can be obtained without applying an electric field to polarize the ferroelectric polymer.

In the preferred embodiment, as shown in FIG. 3, a plurality of the piezoelectric devices 1 are formed to serve as an array of flexible, tactile sensors for a touch panel (not shown). Each of the lower and upper substrate bodies 2, 3 is made of a transparent and flexible material (such as polyether sulfone (PES)), and each of the lower and upper electrodes 121, 122 is made of an electrically conductive material (such as aluminum).

When a force is applied to the touch panel, a corresponding one of the piezoelectric devices 1 is pressed and is caused to deform, thereby generating an electric signal. That is, a potential difference between the lower and upper electrodes 121, 122 of the corresponding piezoelectric device 1 can be detected to determine a touch position on the touch panel.

As shown in FIG. 6, the upper electrode 122 is disposed on the imprint portion 122 having the nano grass-like profile. When the piezoelectric device 1 is pressed to cause the deformation of the nanoimprinted film 110, the imprint portion 112 can have a greater degree of deformation due to a gap 123 defined between the base portion 111 and the upper electrode 122, thereby generating an enhanced piezoelectric response (an enhanced electric signal). In other words, the piezoelectric device 1 can have better sensitivity.

The present invention will now be explained in more detail below by way of the following examples and comparative examples.

Ferroelectric Polymer Film

Example A1

20 g of PVDF-TrFE copolymer powder with 77/23 molar ratio (VDF/TrFE) (Piezo Inc.) and having a Curie point of 120° C.±5% and a melting point of 140° C.±5% was dissolved and evenly dispersed in 400 ml of methyl ethyl ketone (MEK) at 80° C. using a magnetic stirrer to obtain a dispersed solution. The dispersed solution was allowed to stand for a time period, and was spin-coated on a silicon wafer at 500 rpm for 10 seconds, and then at 2000 rpm for 40 seconds to obtain a PVDF-TrFE film having a thickness of 3~5 microns. Subsequently, the PVDF-TrFE film was heated at 85° C. to evaporate the MEK, and then recrystallized at 110° C. for 2 hours to obtain a ferroelectric polymer film.

Example A2

A ferroelectric polymer film was prepared following the procedure employed in Example A1 except that, in Example A2, the PVDF-TrFE film was recrystallized at 120° C. for 2 hours.

Example A3

A ferroelectric polymer film was prepared following the procedure employed in Example A1 except that, in Example A3, the PVDF-TrFE film was recrystallized at 130° C. for 2 hours.

Example A4

A ferroelectric polymer film was prepared following the procedure employed in Example A1 except that, in Example A4, the PVDF-TrFE film was recrystallized at 140° C. for 2 hours.

Example A5

A ferroelectric polymer film was prepared following the procedure employed in Example A1 except that, in Example A5, the PVDF-TrFE film was recrystallized at 145° C. for 2 hours.

Example A6

A ferroelectric polymer film was prepared following the procedure employed in Example A1 except that, in Example A6, the PVDF-TrFE film was recrystallized at 150° C. for 2 hours.

Example A7

A ferroelectric polymer film was prepared following the procedure employed in Example A1 except that, in Example A7, the PVDF-TrFE film was recrystallized at 160° C. for 2 hours.

Comparative Example A8

A ferroelectric polymer film was prepared following the procedure employed in Example A1 except that, in Comparative Example A8, the PVDF-TrFE film was not recrystallized.

X-Ray Diffraction (XRD) Analysis

Figure 7:
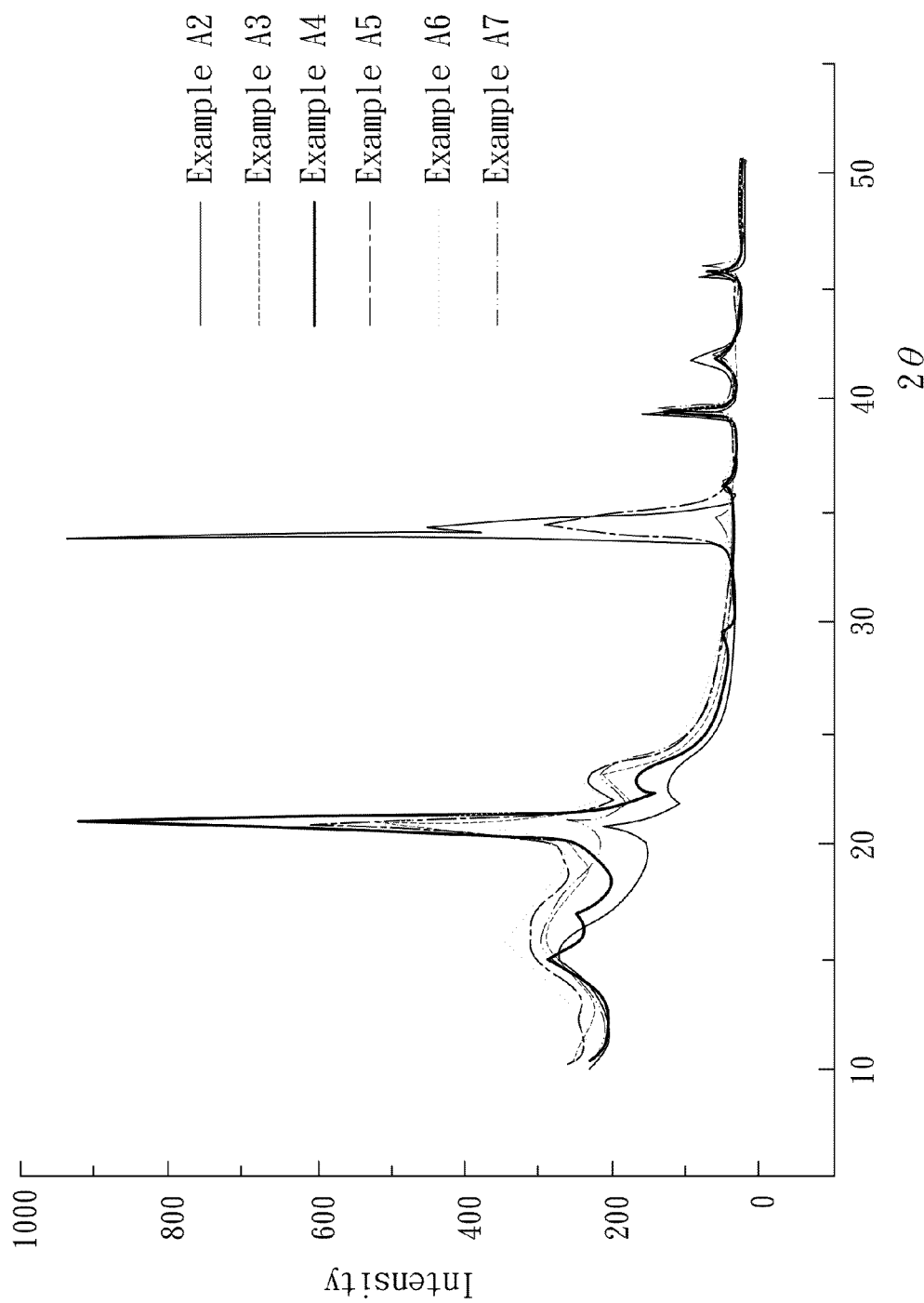
FIG. 7 illustrates X-ray Diffraction (XRD) patterns of ferroelectric polymer films of Examples A2 to A7.

XRD analysis was performed to evaluate crystal structures of the ferroelectric polymer films of Examples A2 to A7, and the results are shown in FIG. 7. It should be noted that if an x-ray powder diffraction spectrum has a peak expressed as $2\theta$ at 20.8°, this means the ferroelectric polymer film (PVDF-TrFE) was recrystallized to have a beta crystalline phase.

From the results shown in FIG. 7, it was found that all of the ferroelectric polymer films (PVDF-TrFE films) of Examples A2 to A7 had a peak expressed as $2\theta$ at 20.8°. However, only when the PVDF-TrFE films were recrystallized at a temperature lower than the melting point by not more than 15° C. (Examples A4 and A5), would the PVDF-TrFE film be predominantly in the beta phase.

Piezoelectric Effect Test

Piezoelectric effect of the ferroelectric polymer film of each of Examples A1 to A7 and Comparative Example A8 was evaluated using piezoresponse force microscopy (PFM) (SEIKO, SPA-300HV) in which a probe tip of a cantilever scanned over the ferroelectric polymer film in contact mode. When the tip of the cantilever contacted and scanned over the ferroelectric polymer film, which was disposed on a sample stage, the cantilever would move up and down according the topography of the ferroelectric polymer, and the movement of the cantilever was observed using a laser beam directed to the cantilever and a laser receiver for receiving a reflected laser from the cantilever. By applying a voltage between the tip and the sample stage, when the ferroelectric polymer film was caused to deform, the deformation of the ferroelectric polymer film can be recorded through the cantilever for calculating a piezoelectric response (amplitude).

Figure 8:
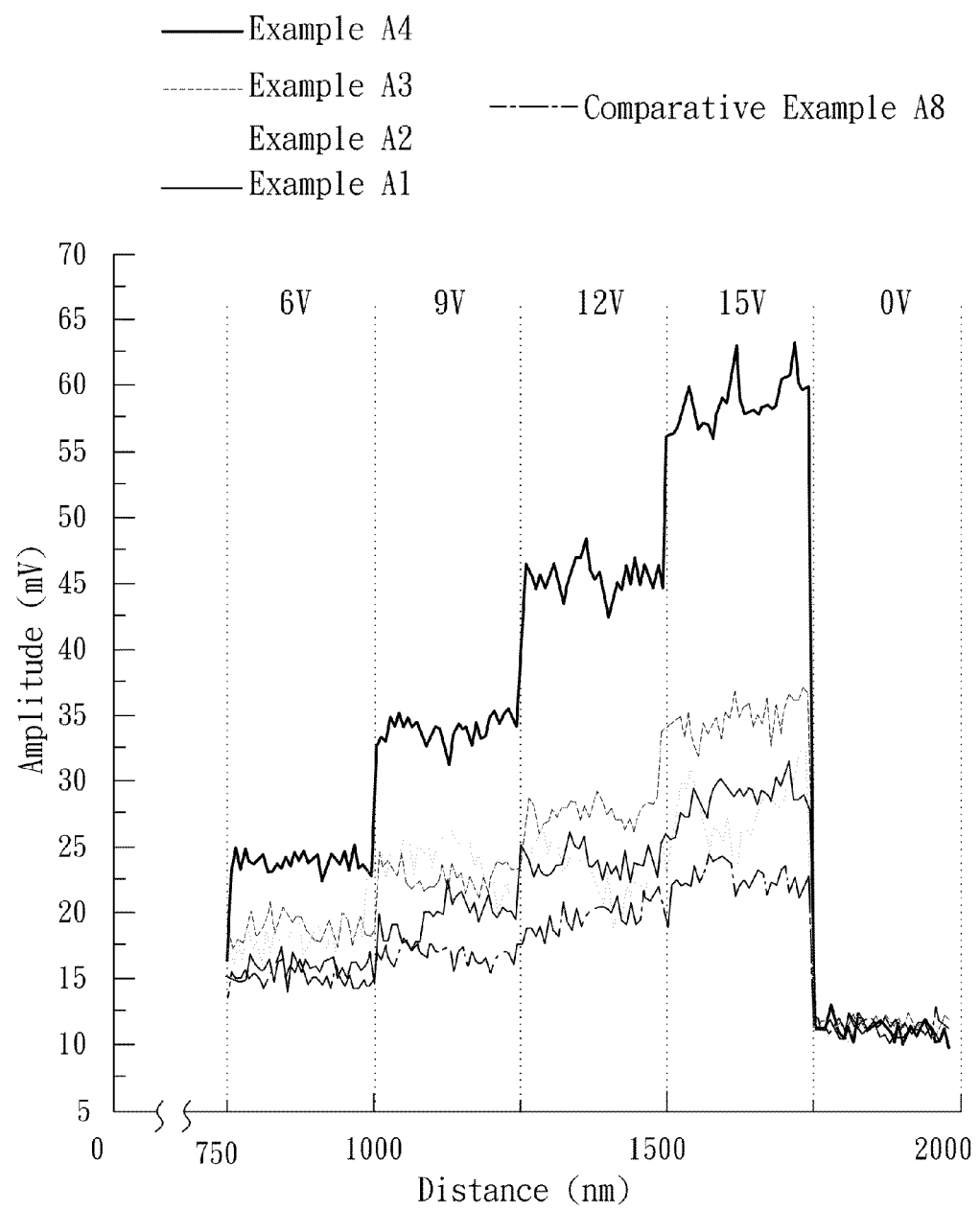
FIGS. 8 and 9 illustrate piezoelectric responses of Examples A1 to A7 and Comparative Example 8.
Figure 9:
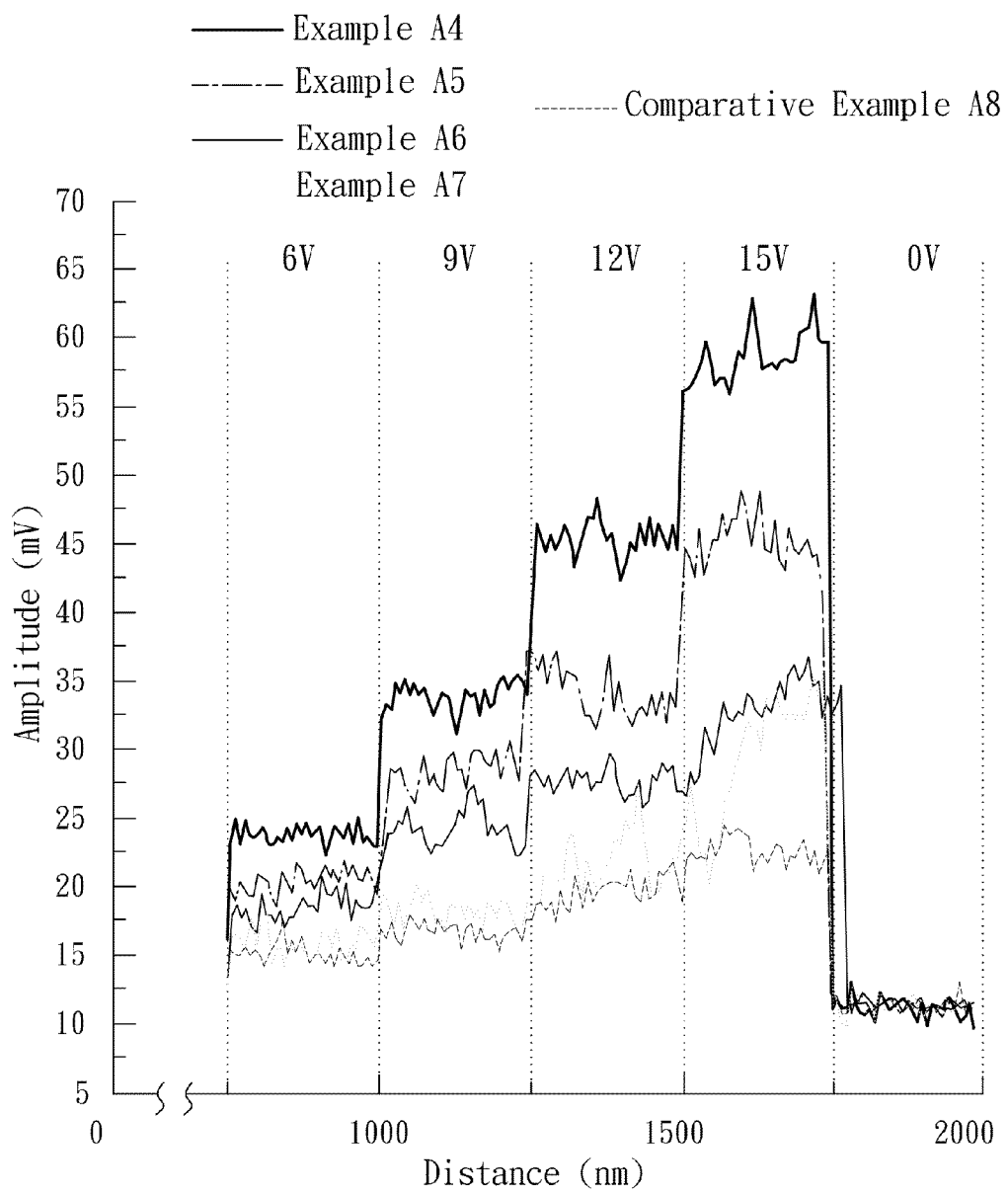

In this test, alternating voltages of 0V, 1V, 3V, 6V, 9V, 12V, 15V, and 0V were respectively applied to the ferroelectric polymer film to be tested at intervals of 250 nm, and were applied through the tip and the sample stage at a frequency of 5 kHz. For the ferroelectric polymer film for each of Examples A1 to A7 and Comparative Example A8, the piezoelectric response was calculated and the results are shown in FIGS. 8 and 9. It should be noted that FIGS. 8 and 9 omit the results of the piezoelectric response where the alternating voltage was less than 6V.

From the results shown in FIGS. 8 and 9, it was found that the ferroelectric polymer films of Examples A4 and A5, which had the predominant beta crystalline phase of PVDF-TrFE, had better piezoelectric response.

Examples B1 to B7

Ferroelectric polymer films of Examples B1 to B7 were prepared following the procedures respectively employed in Examples A1 to A7 except that, in each of Examples B1 to B7, the PVDF-TrFE film was recrystallized for 5 hours.

For each of Examples A1 to A7 and B1 to B7, the ferroelectric polymer film was subjected to the previous piezoelectric effect test using PFM in which the alternating voltage was set to 15V at a frequency of 5 kHz. The piezoelectric response results are shown in FIG. 10.

Figure 10:
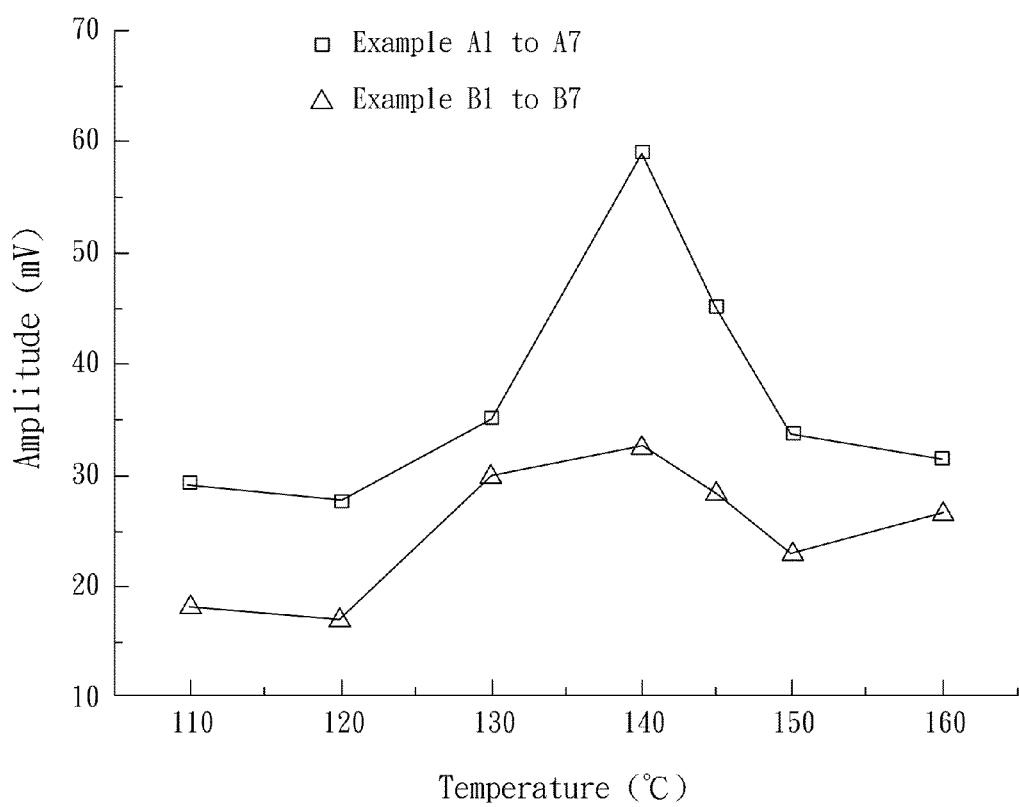
FIG. 10 illustrates piezoelectric responses of Examples A1 to A7 and B1 to B7 when an alternating voltage applied to each of the examples was set to 15V.

From the results shown in FIG. 10, it was found that the ferroelectric polymer films which were recrystallized for 2 hours had better piezoelectric response.

Nanoimprinted Film

Example C1

The ferroelectric polymer film of Example A4 was prebaked at 100° C. for 1 hour, and then disposed on a nanoimprinting template. The nanoimprinting template was prepared according to the method for making a silicon master mold disclosed in the aforementioned article by Chien-Chong Hong et al. such that the film was in contact with the nanopillars of the nanoimprinting template. The template and the film together were put into a heating pressing mold in which the temperature was set to 95° C., and the film was pressed against the template at an initial pressure of 1 kgf/cm². After the temperature of the film reached the mold temperature, the pressing pressure was set to 5 kgf/cm². Thereafter, the film was pressed continuously for 30 minutes, and then removed from the mold, followed by removal of a nanoimprinted film from the template.

Comparative Example C2

20 g of PVDF-TrFE copolymer powder with 77/23 molar ratio (VDF/TrFE) (Piezo Inc.) was dissolved and evenly dispersed in 400 ml of methyl ethyl ketone (MEK) at 80° C. using a magnetic stirrer to obtain a dispersed solution. The dispersed solution was allowed to stand for a time period, and was spin coated on a silicon wafer at 500 rpm for 10 seconds, and then at 2000 rpm for 40 seconds to obtain a PVDF-TrFE film having a thickness of 3~5 microns. The PVDF-TrFE film was heated at 85° C. to evaporate the MEK, and then subjected to a nanoimprinting process substantially the same as that in Example C1, followed by recrystallization at 140° C. for 2 hours to obtain a nanimprinted film. In this comparative example, the nanoimprinting process was implemented before the recrystallization process.

Figure 12:
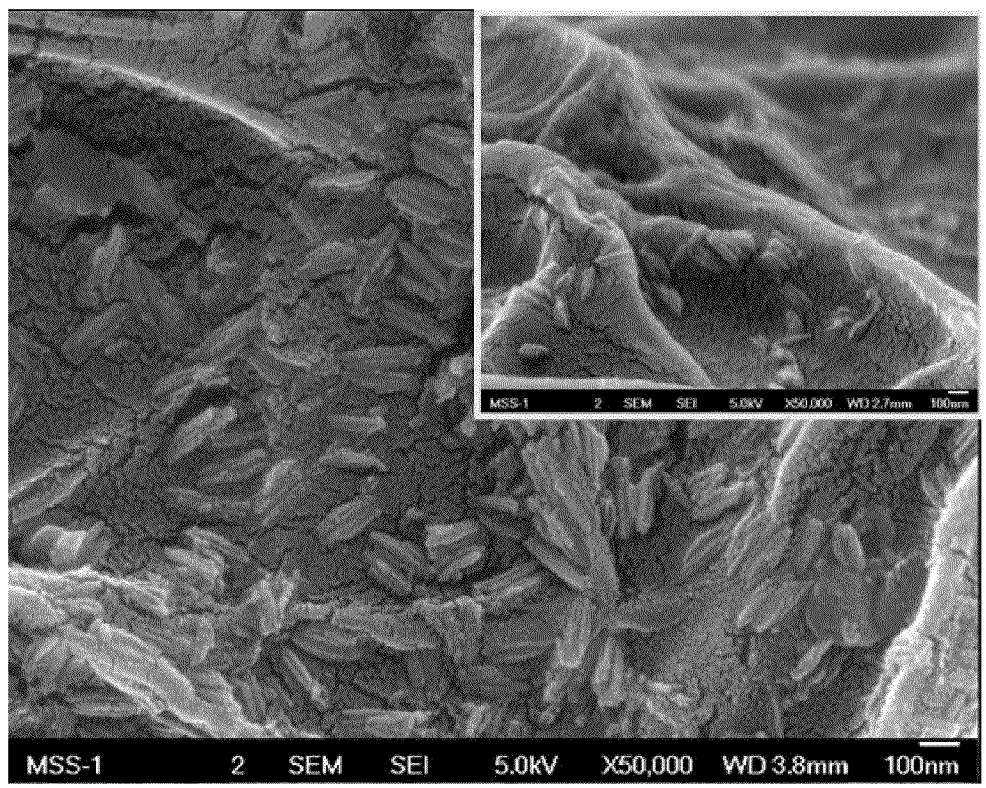
FIG. 12 is a scanning electron microscope image of Comparative Example C2.

The nanoimprinted films of Example C1 and Comparative Example C2 were observed using a scanning electron microscope (SEM), and SEM images thereof are shown respectively in FIGS. 11 and 12. It was found that in Example C1, a plurality of nano-pillars were formed. However, when the nanoimprinting process was implemented before the recrystallization process, the nanopillars were greatly reduced in number.

Piezoelectric Device Array

Example D1

A piezoelectric device array of Example D1 was prepared following the procedures employed in Example C1 except that:

(1) lower and upper substrate units were prepared, each of the lower and upper substrate units including a PES (polyether sulfone) substrate and sixteen electrodes each of which was made of aluminum, and which were arranged in a 4×4 array and connected to one another (as shown in FIG. 3, the electrodes 122 are arranged in a 4×4 array);

(2) the dispersed solution was spin coated on the lower substrate unit to cover the PES substrate and the sixteen electrodes to obtain a PVDF-TrFE film having a thickness of about 20 microns; and (3) the upper substrate unit was stacked on the nanoimprinted film such that the sixteen electrodes of the upper substrate unit were in contact with the nanoimprinted film and in register with the sixteen electrodes of the lower substrate unit, thereby obtaining a piezoelectric device array as shown in FIG. 3.

Comparative Example D2

A piezoelectric device array of Comparative Example D2 was prepared following the procedure employed in Example D1 except that, in Comparative Example D2, the nanoimprinting process was not implemented.

Comparative Example D3

A piezoelectric device array of Comparative Example D3 was prepared following the procedure employed in Example D1 except that, in Comparative Example D3, neither of the recrystallization and nanoimprinting processes was implemented.

Comparative Example D4

A piezoelectric device array of Comparative Example D4 was prepared following the procedure employed in Example D1 except that, in Comparative Example D4, a commercial PVDF film (obtained from PiezoTech) was disposed between the lower and upper substrate units, and was not subjected to the recrystallization process or the nanoimprinting process.

Piezoelectric Signal Test

A cantilever mechanism was prepared. The cantilever mechanism included a cantilever having two ends, one of which was pivotably mounted to a stand, and the other of which had a platinum-coated silicon tip. When the cantilever together with the silicon tip was lifted to a predetermined height and then released, a potential energy of the silicon tip was converted to a kinetic energy, and the silicon tip could hit a sample by a predetermined force.

The piezoelectric device array of each of Example D1 and Comparative Example D2 to D4 was subjected to the piezoelectric signal test. Predetermined forces (98 mN, 49 mN, 24.5 mN, 12.25 mN, and 6.125 mN) were respectively applied to hit each test sample (i.e., the piezoelectric device array). For each hitting, a potential difference between the upper sixteen electrodes and the lower sixteen electrodes of each test sample was detected. The results are shown in FIG. 13.

Figure 13:
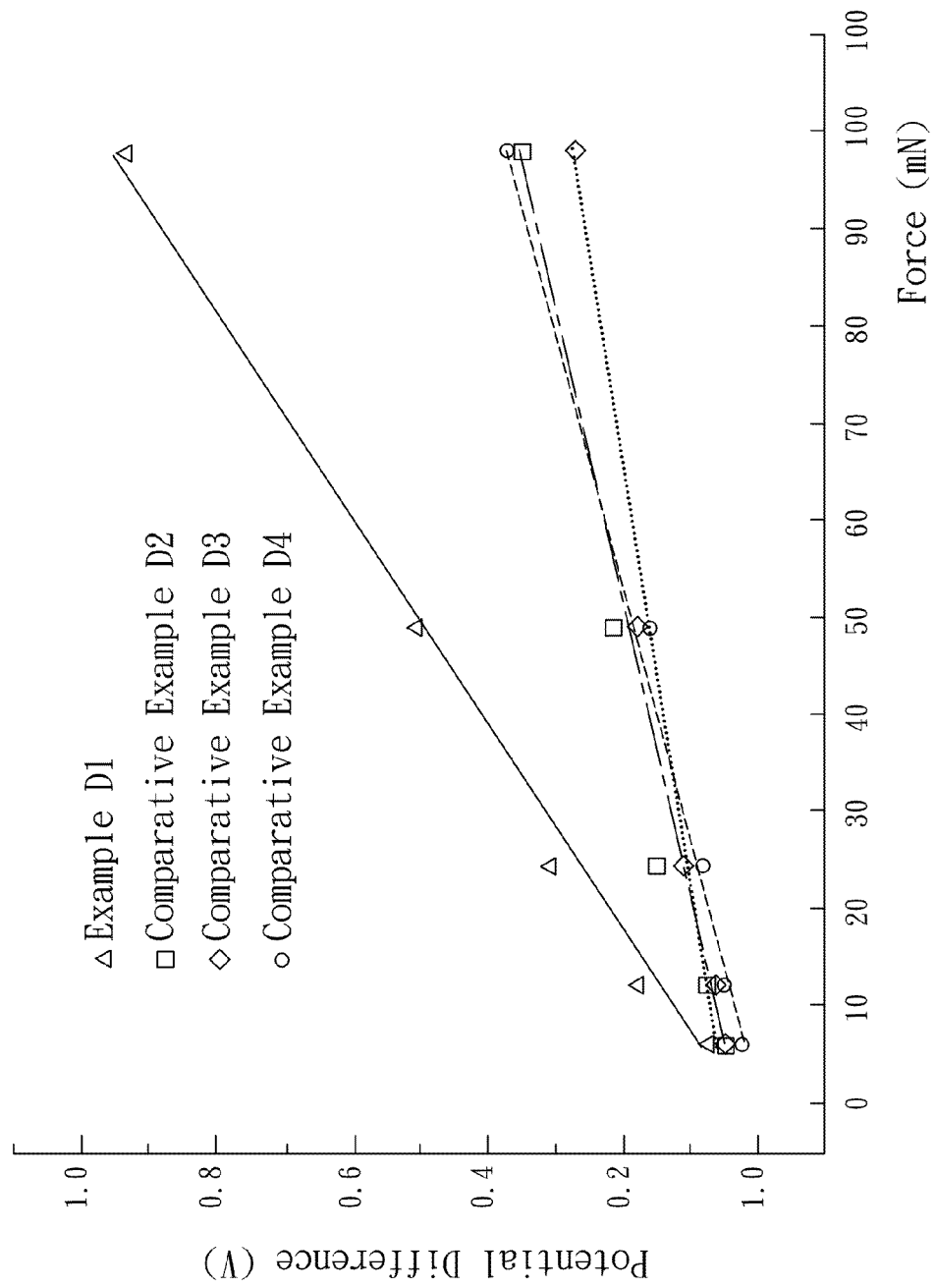
FIG. 13 shows potential differences between two electrodes of a piezoelectric device array of each of Example D1 and Comparative Example D2 to D4 when predetermined forces were applied.

From the results shown in FIG. 13, it was found that when 98 mN was applied to hit the array, the potential difference in the array of Example D1 was greater than 0.9 V, and the potential differences in the arrays of Comparative Examples were about 0.3V or less. Furthermore, the potential difference proportionally increased with an increase in the force applied to each test sample. The slope for each test sample represents the sensitivity thereof. That is, the sensitivity of the piezoelectric device array of Example D1 is 9.5 mV/mN; the sensitivity of the piezoelectric device array of Comparative Example D2 is 3.2 mV/mN; the sensitivity of the piezoelectric device array of Comparative Example D3 is 3.58 mV/mN; and the sensitivity of the piezoelectric device array of Comparative Example D4 is 2.56 mV/mN. In comparison with the Comparative Examples, the piezoelectric device array of Example D1 of this invention had a better sensitivity.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A piezoelectric device made by the following steps of:
   (a) providing a coating material including a ferroelectric polymer;
   (b) applying said coating material onto a lower substrate unit to obtain a coated film in which said ferroelectric polymer has a first conformation state;
   (c) heating said coated film at a heating temperature between a Curie point (Tc) and a melting point (Tm) of said ferroelectric polymer to cause a change in conformation of said ferroelectric polymer from the first conformation state to a second conformation state; and
   (d) subjecting said heat-treated coated film to a nanoimprinting process at an imprinting temperature lower than Tc to cause a change in conformation of said ferroelectric polymer from the second conformation state to a third conformation state that is different from the first conformation state, thereby obtaining a nanoimprinted film.

2. The piezoelectric device of claim 1, wherein said ferroelectric polymer is poly(vinylidene fluoride-trifluoroethylene).

3. The piezoelectric device of claim 2, wherein the heating temperature is lower than Tm by not more than 15° C.

4. The piezoelectric device of claim 3, wherein said ferroelectric polymer in the second conformation state has a predominantly beta crystalline phase.

5. The piezoelectric device of claim 2, wherein the imprinting temperature is lower than Tc by not more than 35° C.

6. The piezoelectric device of claim 1, wherein step (d) is implemented by pressing said heat-treated coated film against a nanoimprinting template which includes an imprinting substrate and a plurality of nanopillars extending upwardly from said imprinting substrate, so as to obtain the nanoimprinted film which includes a base portion and an imprint portion having a nano grass-like profile.

7. The piezoelectric device of claim 6, wherein said lower substrate unit includes a lower substrate body and a lower electrode disposed on said lower substrate body, said coating material being applied to overlie said lower substrate body and to embrace said lower electrode.

8. The piezoelectric device of claim 7, further comprising the steps of:
   (e) providing an upper substrate unit including an upper substrate body and an upper electrode disposed on said upper substrate body; and
   (f) bringing said upper electrode of said upper substrate unit to face and to be in register with said lower electrode such that said upper electrode is spaced apart from said base portion by said imprint portion.

* * * * *